(12) United States Patent
Soenosawa

(10) Patent No.: US 6,489,067 B2
(45) Date of Patent: Dec. 3, 2002

(54) RETICLE FOR MANUFACTURING SEMICONDUCTOR INTEGRATED CIRCUIT

(75) Inventor: Masanobu Soenosawa, Tokyo (JP)

(73) Assignee: NEC Corporation, Tokyo (JP)

( * ) Notice: Subject to any disclaimer, the term of this patent is extended or adjusted under 35 U.S.C. 154(b) by 29 days.

(21) Appl. No.: 09/835,516

(22) Filed: Apr. 17, 2001

(65) Prior Publication Data

US 2001/0033976 A1 Oct. 25, 2001

(30) Foreign Application Priority Data

Apr. 19, 2000 (JP) ........................................ 2000-118276

(51) Int. Cl.$^7$ ................................................. G03F 9/00
(52) U.S. Cl. .......................................................... 430/5
(58) Field of Search ............................................. 430/5

(56) References Cited

FOREIGN PATENT DOCUMENTS

JP          2-127641          5/1990

*Primary Examiner*—Christopher G. Young
(74) *Attorney, Agent, or Firm*—McGinn & Gibb, PLLC

(57) ABSTRACT

A reticle for a semiconductor integrated circuit, in which a scribing line region is adjacent to only two end sides of a circuit pattern region, which are at right angles to each other, and a reticle overlap displacement of shot rotation and a shot magnification component can be measured. The scribing line region is adjacent to only first and second end sides of the circuit pattern region, which are at right angles to each other, and the light shielding region is adjacent to third and fourth end sides. First box marks are formed at predetermined portions of the scribing line regions, which face the first and second end sides, respectively. The concave portions are formed at predetermined portions of the light shielding region, which face the third and fourth end sides, respectively, and each of the second box marks are formed in the concave portions. The light shielding film patterns for light-shielding latent images due to the second box marks by exposure shots to adjacent portions are formed.

11 Claims, 7 Drawing Sheets

| | |
|---|---|
| 1 | FIRST BOX MARK |
| 2 | SECOND BOX MARK |
| 3 | LIGHT SHIELDING FILM PATTERN |
| 4 | CONCAVE PORTION OF LIGHT SHIELDING REGION |
| 5 | ALIGNMENT PATTERN |
| 6 | TEG PATTERN |
| 7 | CIRCUIT PATTERN REGION |
| 8 | SCRIBING LINE REGION |
| 9 | LIGHT SHIELDING REGION |
| 11 | FIRST END SIDE |
| 12 | SECOND END SIDE |
| 13 | THIRD END SIDE |
| 14 | FOURTH END SIDE |
| 100 | RETICLE |

ONE SHOT EXPOSURE REGION

ONE SHOT
EXPOSURE REGION

RETICLE FOR MANUFACTURING SEMICONDUCTOR INTEGRATED CIRCUIT

BACKGROUND OF THE INVENTION

1. Field of the Invention

The present invention relates to a reticle for manufacturing a semiconductor integrated circuit, as a mask to be used in a reduction projection exposure apparatus in a photolithography manufacturing process for a semiconductor integrated circuit device.

2. Description of the Related Art

FIG. 1 shows a reticle 300 of a conventional technique. The reticle 300 has a circuit pattern region 37 for exposing a predetermined pattern to a semiconductor chip forming portion of a semiconductor wafer, a scribing line region 38 for exposing a pattern of a cutting region for separating the semiconductor chip, and a light shielding region 39 surrounding these regions. A width of the scribing line region 38 is W/2, for example, 250 μm. In the case of ⅕ reduction exposure, a width w/2 in a semiconductor wafer is 50 μm.

In exposure using this reticle, as shown in FIG. 2, a shot (a region for one shot is represented by a bold line in the drawing) is performed with alignment to an outer circumference of the scribing line region. Thus, the width w/2 by the shots to adjacent portions are aligned with each other to obtain a cutting region with a width w (=100 μm) in total. By the way, in FIG. 2, characters 37M and 38M are latent images for the circuit pattern region 37 and the scribing line region 38, respectively, which are formed in a resist by exposure.

However, the width of the scribing line region 38 of this reticle is W/2, and corresponds to the half width w/2 (=50 μm) of a cutting region on a wafer. Thus, wafer alignment marks and TEG (test element group) patterns, which utilize the width w (=100 μm) of the cutting region and have large areas cannot be formed.

FIG. 3 shows a reticle 400 of other conventional techniques. The reticle 400 has a circuit pattern region 47, a scribing line region 48, and a light shielding region 49 surrounding these regions. The width of the scribing line region 48 is W, for example, 500 μm. In the case of ⅕ reduction exposure, a width w in a semiconductor wafer is 100 μm, and becomes the width of the entire cutting region.

In exposure using this reticle 400, as shown in FIG. 4, each shot (a region for one shot is represented by a bold line in the drawing) is performed such that the scribing line regions are overlapped with each other. Since the width of the scribing line region 48 of this reticle has a large size W corresponding to a width w (=100 μm) on a wafer, wafer alignment marks and TEG patterns, which utilize the width w of the cutting region and have large areas can be formed. By the way, in FIG. 4, characters 47M and 48M are latent images for the circuit pattern region 47 and the scribing line region 48, respectively, which are formed in a resist by exposure.

However, since double exposure is performed for the scribing line region in adjacent shots, it is necessary to form a complicated light shielding pattern in the scribing line region. This imposes a large burden in a reticle pattern arrangement design and is impractical.

Therefore, a scribing line one-side width/2 W of FIG. 1 is extended, and with this state, the scribing line width w on a wafer is extended. For, example, when w/2 is 50 μm, the scribing line width w is 100 μm. Also, when w/2 is 100 μm, in order to form wafer alignment marks and TEG patterns, which have large areas, the scribing line width w is 200 μm.

As described above, a method as shown in FIG. 4 is not used, and with the state as shown in FIG. 2 it is normally designed so that the distance between circuit patterns is extended.

However, in this case, since the scribing line width on the wafer is overextended, the number of circuit patterns which can be formed on the wafer, that is, the number of available chips decrease. Also, if the number of chips per wafer are decreased, it is necessary to spread extra wafers (increase the number of wafers) for the decreased amount, therefore the cost is increased.

To solve the above problems, a reticle as shown in FIG. 5 is disclosed in Japanese Patent Application Laid-open No. Hei 2-127641. In FIG. 5, a reticle 500 has a circuit pattern region 57, a scribing line region 58, and a light shielding region 59 surrounding these regions. The scribing line region 58 with a wide width W is coupled with the circuit pattern region 57 and located adjacent to only two end sides of the circuit pattern region 57.

According to this reticle 500, since the scribing line region 58 has a wide width W, wafer alignment patterns 55 and TEG patterns 56, which utilize the width w of the cutting region and have large areas can be formed. Also, as shown in FIG. 6, since each shot (a region for one shot is represented by a bold line in the drawing) is performed such that the scribing line regions are not overlapped with each other, it is unnecessary to form a complicated light shielding pattern in the scribing line region. Also, since a width of the scribing line region is not extended unnecessarily, the number of available chips which can be formed on a wafer are not decreased.

However, in the case of this reticle 500, alignment measurement marks (since a typical alignment measurement mark is a box mark, hereinafter explained as the box mark) 51 for overlap measurement can only be formed in end sides outside the two end sides of the circuit pattern. Thus, even if overlap against a pattern formed in before process step can be measured on a semiconductor wafer, a reticle overlap displacement of such as shot rotation and a shot magnification component cannot be measured.

By the way, in FIG. 6, characters 51M, 55M, 56M, 57M and 58M are latent images for the box marks 51, the wafer alignment patterns 55, the TEG patterns 56 the circuit pattern region 57 and the scribing line region 58, respectively, which are formed in a photoresist by exposure.

As explained above, with respect to the reticle of the conventional technique of FIG. 1, the wafer alignment marks and the TEG patterns which utilize the width w of the cutting region and have large areas cannot be formed.

With respect to the reticle of other conventional technique of FIG. 3, it is necessary to use complicated light shielding means for the scribing line region. This complicates a reticle pattern arrangement design and is impractical.

Also, in the reticle of the conventional technique of FIG. 1, when w/2 is extended, the number of chips per wafer are decreased, thereby increasing the cost by the decrease.

To solve these problems, with respect to the reticle of other conventional technique shown in FIG. 5, in which the scribing line region is located adjacent to only two end sides of the circuit pattern region, a reticle overlap displacement of shot rotation and a shot magnification component cannot be measured.

SUMMARY OF THE INVENTION

Therefore, an object of the present invention is to provide an effective reticle for manufacturing a semiconductor integrated circuit, in which a scribing line region is located adjacent to only two end sides of a circuit pattern region, which are at right angles to each other, and in which alignment measurement marks, preferably box marks for overlap measurement are formed along each of the four end sides of the circuit pattern region, so that a reticle overlap displacement of shot rotation and a shot magnification component can be measured.

According to the present invention, there is provided a reticle for manufacturing a semiconductor integrated circuit, which reticle comprises a circuit pattern region for exposing a predetermined pattern to a semiconductor chip forming portion of a semiconductor wafer and surrounded by first to fourth straight end sides thereof, a scribing line region for exposing a pattern of a cutting region for separating a semiconductor chip from the semiconductor wafer, and a light shielding region formed to surround the circuit pattern region and the scribing line region. The scribing line region is adjacent to, out of a first end side to a fourth end side of the circuit pattern region, only the first and second end sides, which are orthogonal to each other. The light shielding region is adjacent to the third and fourth end sides. The reticle of the present invention further comprises first alignment measurement marks formed at predetermined portions of the scribing line region, which face the first and second end sides, respectively, concave portions formed at predetermined portions of the light shielding region, which face the third and fourth end sides, respectively, second alignment measurement marks formed in the concave portions, respectively, and light shielding film patterns for light-shielding the portions formed, where latent images due to the second alignment measurement marks, caused by exposure shots to the adjacent portions, are formed. The first alignment measurement marks are preferably first box marks, and the second alignment measurement marks are preferably second box marks.

Here, it is preferred that the first alignment measurement marks and the second alignment measurement marks have the same shape. Also, convex portions can be formed as the light shielding film patterns in an inner circumference of the light shielding region. Further one of the second alignment measurement marks and one of the light shielding film patterns can be arranged linearly parallel to one of end sides.

Also, when a width of the scribing line region is given as W, it is preferred that the first and second alignment measurement marks are formed at portions at a distance W/2 or less from the respective end sides of the circuit pattern region, and the light shielding film patterns are formed at portions at a distance W/2 or less from an outer circumference of the scribing line region. Further, the width of the light shielding film patterns can be made equal to that of the concave portions, moreover, the shape the light shielding film patterns can be made equal to that of the concave portions.

Also, the alignment measurement marks can be formed along the respective end sides one by one. Alternatively, the alignment measurement marks can be formed along the respective end sides by plural numbers, respectively.

Further, a pattern for one semiconductor chip can be formed in the circuit pattern region. Alternatively, patterns for a plurality of semiconductor chips can be formed in the circuit pattern region.

Also, it is preferred that an alignment pattern, a TEG pattern or both of these patterns are formed in the scribing line region.

BRIEF DESCRIPTION OF THE DRAWINGS

This above-mentioned and other objects, features and advantages of this invention will become more apparent by reference to the following detailed description of the invention taken in conjunction with the accompany drawings, wherein.

DETAILED DESCRIPTION OF THE PREFERRED EMBODIMENTS

The present invention will be described with reference to the accompanying drawings.

Figure 1:
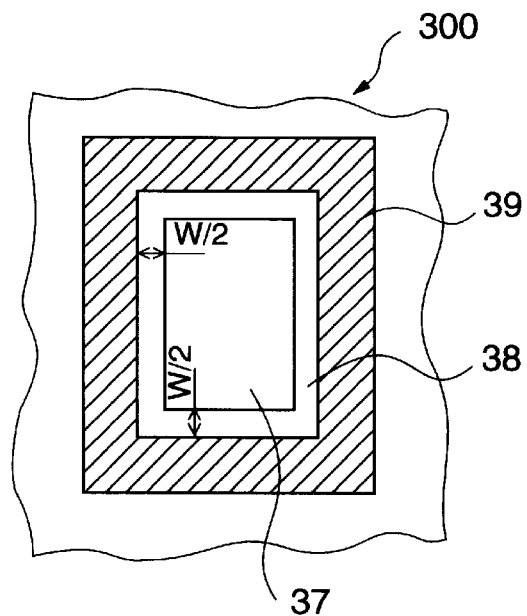
FIG. 1 is a plan view showing a reticle of a conventional technique.
Figure 2:
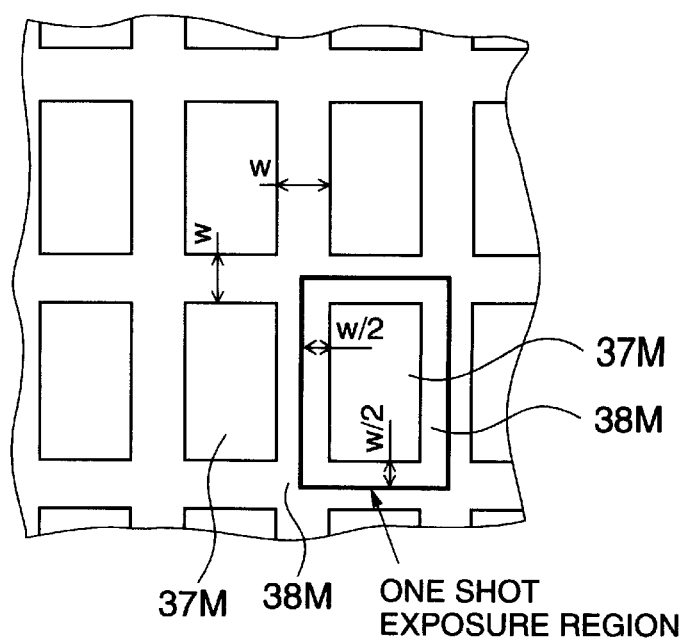
FIG. 2 is a plan view showing a one shot exposure region and images on an wafer using the reticle of FIG. 1.
Figure 3:
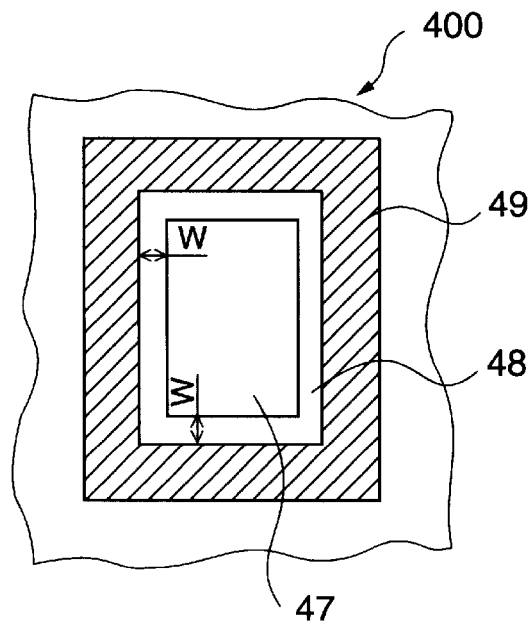
FIG. 3 is a plan view showing a reticle of other conventional technique.
Figure 4:
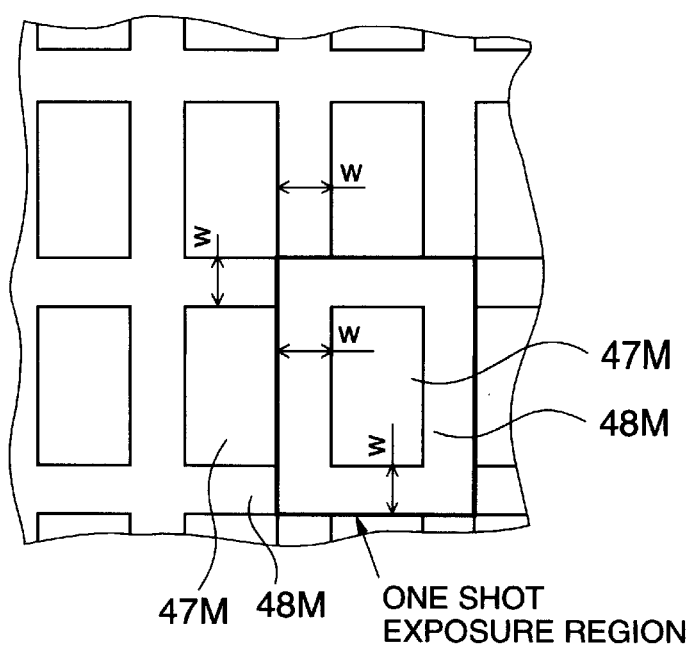
FIG. 4 is a plan view showing a one shot exposure region and images on an wafer using the reticle of FIG. 3.
Figure 5:
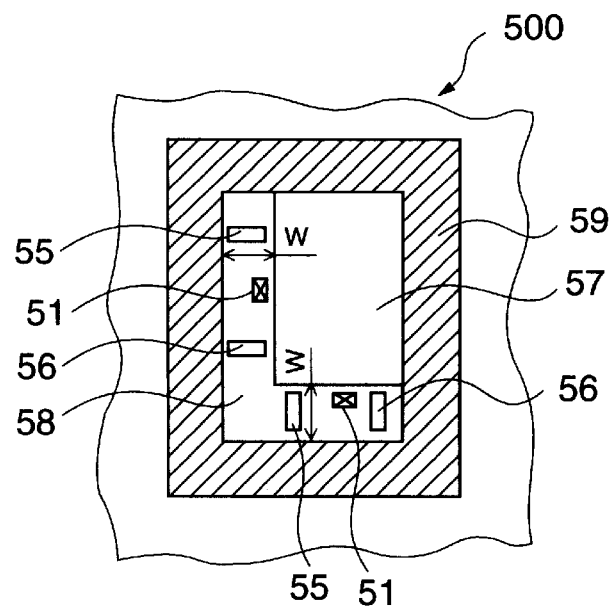
FIG. 5 is a plan view showing a reticle of further other conventional technique.
Figure 6:
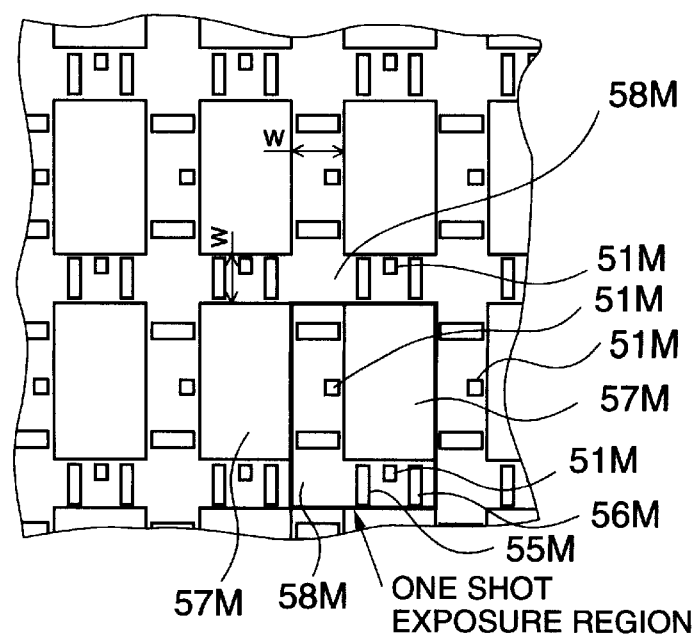
FIG. 6 is a plan view showing one shot exposure region and images on an wafer using the reticle of FIG. 6.
Figure 7:
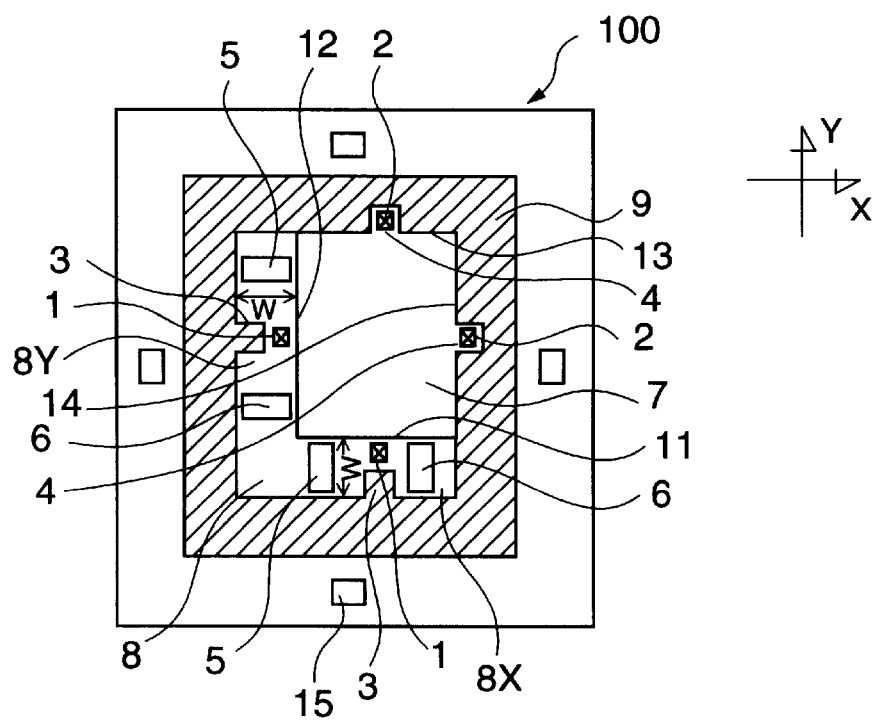
FIG. 7 is a plan view showing a reticle for manufacturing a semiconductor integrated circuit according to a first embodiment of the present invention.
Figure 8:
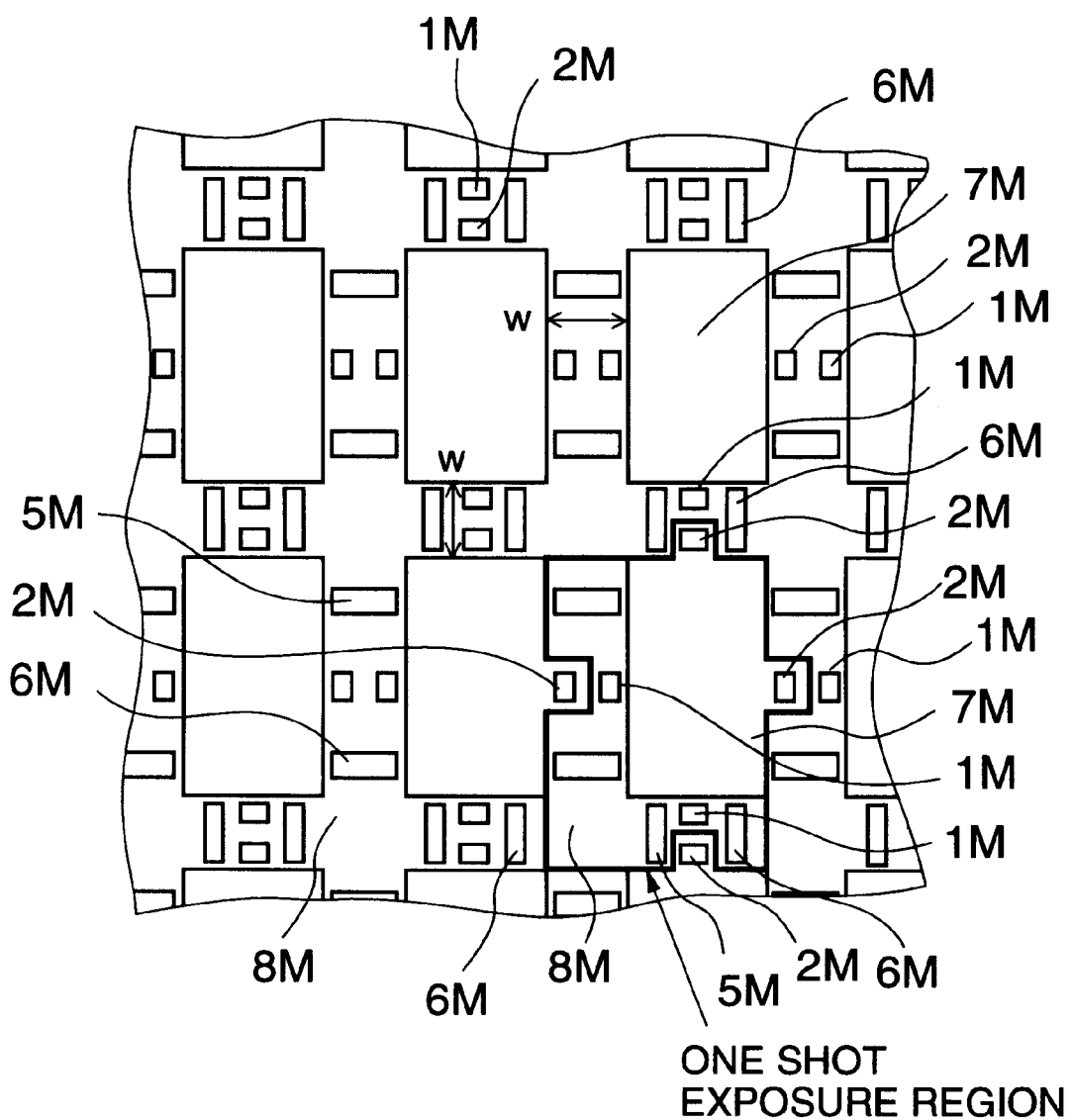
FIG. 8 is a plan view showing one shot exposure region and images on an wafer using the reticle of FIG. 7.

FIG. 7 is a plan view showing a reticle 100 for manufacturing a semiconductor integrated circuit according to a first embodiment of the present invention, and FIG. 2 is a plan view showing an exposure region for one shot on a semiconductor wafer using the reticle of FIG. 8 and latent images (images) formed in a photoresist by exposure.

Referring to FIG. 7, the reticle 100 has, on a transparent glass substrate, a circuit pattern region 7 for exposing a predetermined pattern to a semiconductor chip forming portion on a semiconductor wafer, a scribing line region 8 for exposing a pattern of a cutting region for separating the semiconductor chip from the semiconductor wafer, a light shielding region 9 formed to surround the circuit pattern region 7 and the scribing line region 8, and reticle alignments 15 formed outside the light shielding area 9, to perform positioning of the reticle with respect to an exposure apparatus.

A scribing line region 8 includes an X-directional scribing line region 8X and a Y-directional scribing line region 8Y. The X-directional scribing line region 8X adjacent to a first end side 11 of the circuit pattern region 7, which is extended along an X-direction, and the Y-directional scribing line region 8Y adjacent to a second end side 12 which is extended along a Y-direction perpendicular to the X-direction, are coupled to each other, so that the scribing line region 8 having a width W as a whole is formed with an L-shape.

Also, alignment patterns 5 and TEG patterns 6, which utilize the width w and have large areas, are formed in the X-directional scribing line region 8X and the Y-directional scribing line region 8Y, respectively.

A third end side 13 of the circuit pattern region 7, which is extended along the X-direction, and a fourth end side 14, which is extended along the Y-direction, are adjacent to the light shielding region 9.

First box marks 1 and 1 as first alignment measurement marks are formed in portions which are within the scribing line region and are apart from the centers of the first and second end sides toward the outside by W/2 or less.

Concave portions 4 and 4 are provided in portions of the light shielding region, which are adjacent to the centers of the third and fourth end sides, respectively. The second box marks 2 and 2 as second alignment measurement marks having the same shape as that of the first box marks are formed within these concave portions which are apart from the centers of the third and fourth end sides toward the outside by W/2 or less.

Convex portions which protrude in a direction of the scribing line region 8 are formed in the light shielding region 9 made of a chromium film. The convex portions correspond to light shielding film patterns 3 and 3. Also, the light shielding film patterns 3 having the same shape as that of the concave portions 4 are located in portions which are apart from an outer circumference of the scribing line region by W/2 or less.

Further, one of the second box marks 2 and 2, and one of the light shielding film patterns 3 and 3 are located in the same X-coordinate, and each of the others are located in the same Y-coordinate. That is, these are arranged on a straight line extending X or Y direction.

By such a structure, exposure can be performed such that latent images due to the second box marks 2 by exposure shots to adjacent portions are light-shielded with the light shielding film patterns 3.

That is, as shown in FIG. 8, when a certain exposure shot (a region for one shot is represented by a bold line in the drawing) is performed, portions in which the latent images 2M due to the second box marks 2 formed upon an exposure shot adjacent to the left side in the drawing are formed are light-shielded with the light shielding patterns 3. Similarly, portions in which the latent images 2M due to the second box marks 2 formed upon an exposure shot adjacent to the lower side in the drawing are formed are also light-shielded with the light shielding patterns 3. By the way, each latent image before development becomes each photoresist pattern by the development.

As described above, using the reticle shown in FIG. 8, the entire semiconductor wafer is sequentially exposed by step-and-repeat, so that all latent images including latent images due to the box marks formed by each exposure are present as it is.

Therefore, after the exposure, a reticle overlap displacement of shot rotation and a shot magnification component can be measured by measuring box mark resist patterns each formed in four directions of a circuit pattern region appearing from development of a photoresist.

By the way, in FIG. 8, characters 1M, 2M, 5M, 6M, 7M and 8M are latent images before development and resist patterns after development with respect to the first box marks 1, the second box marks 2, the wafer alignment marks 5, the TEG patterns 6, the circuit pattern region 7, and the scribing line region 8, respectively which are formed in the photoresist by the exposure.

In FIG. 7, although the case where the box marks are formed along the end sides one by one and the light shielding patterns are formed corresponding to the box marks is illustrated, the box marks may be formed along the end sides by a plurality of items and the light shielding patterns may be formed corresponding to the box marks.

Figure 9:
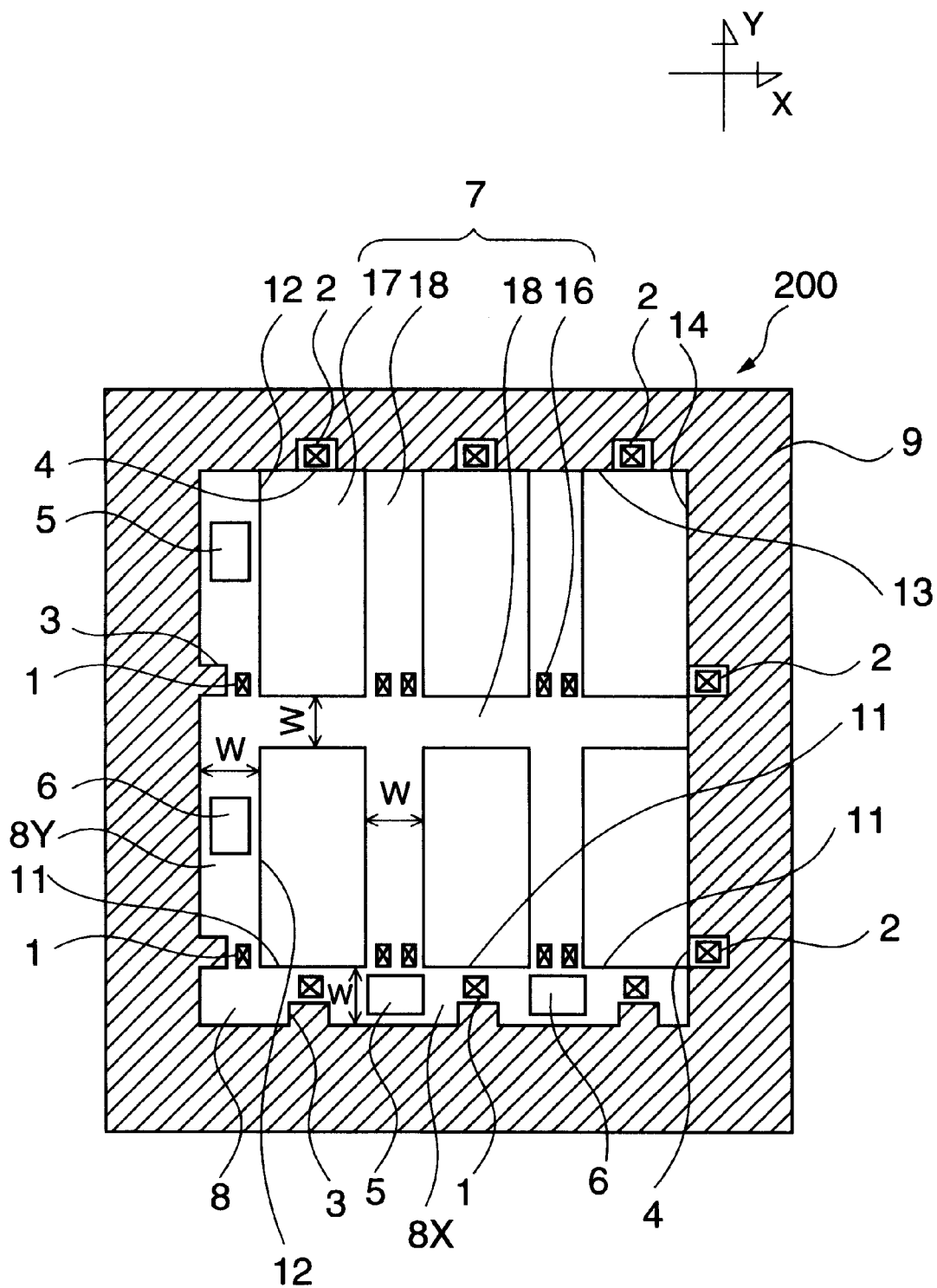
FIG. 9 is a plan view showing a reticle for manufacturing a semiconductor integrated circuit according to a second embodiment of the present invention.
Figure 10:
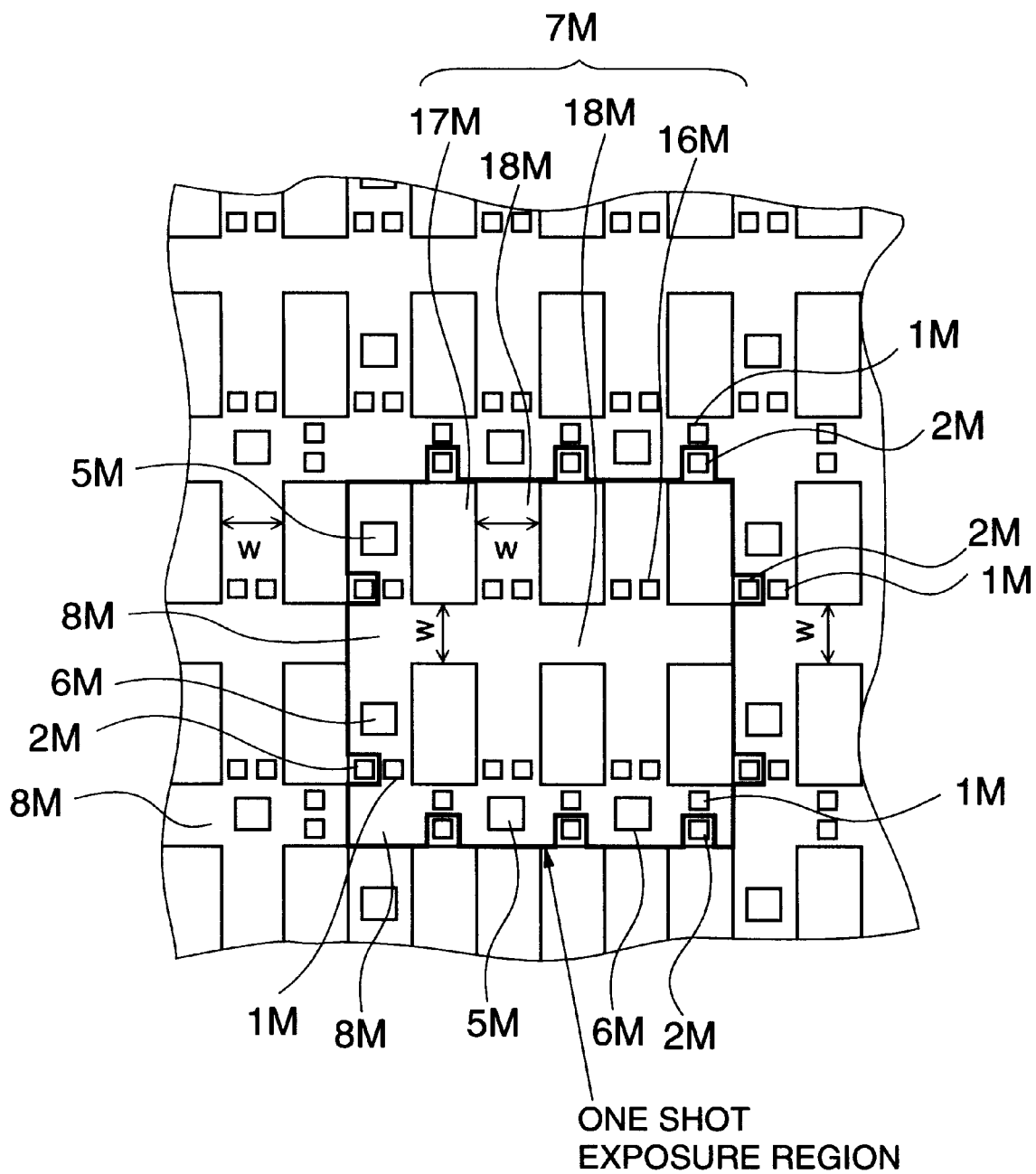
FIG. 10 is a plan view showing one shot exposure region and images on an wafer using the reticle of FIG. 9.

FIG. 9 is a plan view showing a reticle 200 for a semiconductor integrated circuit according to a second embodiment of the present invention, and FIG. 10 is a plan view showing an exposure region for one shot on a semiconductor wafer using the reticle of FIG. 10 and latent images formed in a photoresist by exposure. By the way, since portions of FIG. 9 and FIG. 10, which are identical with or similar to those of FIG. 7 and FIG. 8 are referred with the same references and characters, the duplicate explanation is omitted here.

In FIG. 7 and FIG. 8, the case is described where a pattern for one semiconductor chip is formed in the circuit pattern region 7 is illustrated. However, in this embodiment of FIG. 9 and FIG. 10, patterns for a plurality of semiconductor chips are formed in the circuit pattern region 7. That is, chip forming regions 17 for each of the six semiconductor chips are arranged within the circuit pattern region 7. A scribing line region 18 having the same width W as that of the scribing line region 8 located outside the circuit pattern region 7 are provided between adjacent chip forming regions 17. A plurality of box marks 16 are provided within the circuit pattern region 7.

With respect to the first box marks 1 of the present invention, three items are provided along the first end side 11 of the circuit pattern region 7, and two items are provided along the second end side 12 thereof.

Also, with respect to the second box marks 2 and the concave portions 4 in the present invention, three items for each are provided along the third end side 13 of the circuit pattern region 7, and two items for each are provided along the fourth end side 14 thereof. Further, the light shielding film patterns 3 are formed corresponding to each of the second box marks 2.

Even in the case of the reticle 200 of FIG. 9, as shown in FIG. 10, when exposure shots (a region for one shot is represented by a bold line in the drawing) are performed, portions in which the latent images 2M due to the second box marks upon exposure shots to adjacent portions are formed are light-shielded with the light shielding patterns 3. Thus, the entire semiconductor wafer is exposed by step-and-repeat.

By the way, in FIG. 10, characters 16M, 17M and 18M are latent images before development and photoresist pattern after development for each of the box marks 16, the chip forming regions 17 and the scribing line regions 18, which are formed in a photoresist by exposure.

As explained above, according to the present invention, in the reticle in which the scribing line region is adjacent to only two end sides of the circuit pattern region, which are orthogonal to each other, the box marks as the alignment measurement marks for overlap measurement are formed in each of the four end sides of the circuit pattern region, so that a reticle overlap displacement of shot rotation and a shot magnification component can be measured.

What is claimed is:

1. A reticle for manufacturing a semiconductor integrated circuit, comprising:

a circuit pattern region for exposing a predetermined pattern to a semiconductor chip forming portion of a semiconductor wafer, said circuit pattern region being surrounded first to fourth end sides;

a scribing line region for exposing a pattern of a cutting region for separating a semiconductor chip from the semiconductor wafer, said scribe line region being adjacent to only said first and second end sides among said first to fourth end sides, said first and second end sides being at right angles to each other;

a light shielding region formed to surround said circuit pattern region and said scribing line region, said light shielding region being adjacent to said third and fourth end sides;

first alignment measurement marks formed at predetermined portions of said scribing line region, which face said first and second end sides, respectively;

concave portions formed at predetermined portions of said light shielding region, which face said third and fourth end sides, respectively;

second alignment measurement marks formed in said concave portions, respectively; and light shielding film patterns for light-shielding formed, respectively, at positions where latent images due to said second alignment measurement marks caused by exposure shots to the adjacent portions are formed.

2. The reticle for manufacturing a semiconductor integrated circuit according to claim 1, wherein said first alignment measurement marks and said second alignment measurement marks have the same shape.

3. The reticle for manufacturing a semiconductor integrated circuit according to claim 1, convex portions are formed as said light shielding film patterns in an inner circumference of said light shielding region.

4. The reticle for manufacturing a semiconductor integrated circuit according to claim 1, one of said second alignment measurement marks and one of said light shielding film patterns are arranged in a straight line parallel to one of said end sides.

5. The reticle for manufacturing a semiconductor integrated circuit according to claim 1, wherein when a width of said scribing line region is given as W, said first and second alignment measurement marks are formed at portions at a distance of W/2 or less from the respective end sides of said circuit pattern regions, and said light shielding film patterns are formed at portions at a distance of W/2 or less from an outer circumference of said scribing line region.

6. The reticle for manufacturing a semiconductor integrated circuit according to claim 1, wherein the shape of said light shielding film patterns is equal to the shape of said concave portions.

7. The reticle for manufacturing a semiconductor integrated circuit according to claim 1, wherein said alignment measurement marks are formed one by one along the respective end sides.

8. The reticle for manufacturing a semiconductor integrated circuit according to claim 1, wherein said alignment measurement marks are formed along the respective end sides by plural numbers, respectively.

9. The reticle for manufacturing a semiconductor integrated circuit according to claim 1, wherein a pattern for one semiconductor chip is formed in said circuit pattern region.

10. The reticle for manufacturing a semiconductor integrated circuit according to claim 1, wherein patterns for a plurality of semiconductor chips are formed in said circuit pattern region.

11. The reticle for manufacturing a semiconductor integrated circuit according to claim 1, wherein an alignment pattern, a TEG pattern or both of these patterns are formed in said scribing line region.

* * * * *